US010019350B1

(12) United States Patent
Lee et al.

(10) Patent No.: US 10,019,350 B1
(45) Date of Patent: Jul. 10, 2018

(54) DRAM AND METHOD FOR ACCESSING A DRAM

(71) Applicant: NANYA TECHNOLOGY CORPORATION, New Taipei (TW)

(72) Inventors: Chung-Hsun Lee, New Taipei (TW); Hsien-Wen Liu, Luzhu Township, Taoyuan County (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 15/667,202

(22) Filed: Aug. 2, 2017

(51) Int. Cl.
*G11C 11/24* (2006.01)
*G06F 12/02* (2006.01)
*G06F 12/06* (2006.01)
*G11C 11/408* (2006.01)

(52) U.S. Cl.
CPC ...... *G06F 12/0207* (2013.01); *G06F 12/0607* (2013.01); *G11C 11/408* (2013.01)

(58) Field of Classification Search
CPC G06F 12/0207; G06F 12/0607; G11C 11/408
See application file for complete search history.

(56) References Cited

U.S. PATENT DOCUMENTS

| 2014/0003173 A1* | 1/2014 | Ku | G11C 29/04 365/200 |
| 2016/0027532 A1* | 1/2016 | Kim | G11C 29/83 365/200 |
| 2016/0139833 A1* | 5/2016 | Chang | G11C 11/4076 711/105 |
| 2017/0287544 A1* | 10/2017 | Hedden | G11C 11/406 |
| 2017/0287547 A1* | 10/2017 | Ito | G11C 11/40611 |

* cited by examiner

*Primary Examiner* — Mohammed A Bashar
(74) *Attorney, Agent, or Firm* — Muncy, Geissler, Olds & Lowe, P.C.

(57) ABSTRACT

The present disclosure provides a method. The method includes copying a data stored in memory cells associated with a normal word line subject to a row hammer effect into memory cells associated with a hot word line before a condition is satisfied, wherein the condition includes an access frequency of the normal word line reaching a threshold frequency; accessing, based on a logical address, the normal word line before the condition is satisfied; accessing, based on the logical address, the hot word line associated with the copied data only if the condition is satisfied; and accessing the data no longer from the normal word line only if the condition is satisfied.

12 Claims, 14 Drawing Sheets

DRAM AND METHOD FOR ACCESSING A DRAM

TECHNICAL FIELD

The present disclosure relates to a dynamic random access memory (DRAM), and more particularly, to a DRAM and method for accessing a DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charges are stored in the capacitor, the cell is said to store a logic HIGH, depending on the convention used. If no charge is present, the cell is said to store a logic LOW. Because the charges in the capacitor dissipate over time, DRAM systems require additional refreshing circuitries to periodically refresh the charges stored in the capacitors. Since a capacitor can store only a very limited amount of charges, in order to quickly distinguish the difference between a logic 1 and a logic 0, two bit lines (BLs) are typically used for each bit, wherein the first in the bit line pair is known as a bit line true (BLT) and the other is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM. The DRAM includes a normal area, a hot area and a control device. The normal area includes a plurality of memory cells controllable by a normal word line and configured to store a data. The hot area includes a plurality of memory cells controllable by a hot word line. The control device is configured to copy the data stored in the memory cells associated with the normal word line which has been frequently accessed into the memory cells associated with the hot word line before a condition is satisfied; to access, the normal word line before the condition is satisfied; to access the hot word line associated with the copied data only if the condition is satisfied; and to no longer access the data from the normal word line only if the condition is satisfied. The condition includes an access frequency of the normal word line reaching a threshold frequency.

In some embodiments, the threshold frequency is a second threshold frequency. The control device copies the data stored in the memory cells associated with the normal word line only if a first condition, of the access frequency of the normal word line reaching a first threshold frequency less than the second frequency, is satisfied.

In some embodiments, the control device establishes a mapping relationship between the logical address and the hot physical address only if the first condition is satisfied.

In some embodiments, the control device accesses the hot word line based on a hot physical address of the hot word line only if the condition is satisfied and a mapping relationship between the logical address and the hot physical address is present.

In some embodiments, the control device accesses the hot word line based on a hot physical address of the hot word line only if a mapping relationship between the logical address and the hot physical address is present and the condition is satisfied.

In some embodiments, an approach performed by the control device to determine whether the access frequency of the normal word line reaches one of the first threshold frequency and the second threshold frequency is taken by detecting the logical address and counting how many times the logical address has been detected.

Another aspect of the present disclosure provides a method. The method includes copying a data stored in memory cells associated with a normal word line subject to a row hammer effect into memory cells associated with a hot word line before a condition is satisfied, wherein the condition includes an access frequency of the normal word line reaching a threshold frequency; accessing, based on a logical address, the normal word line before the condition is satisfied; accessing, based on the logical address, the hot word line associated with the copied data only if the condition is satisfied; and accessing the data no longer from the normal word line only if the condition is satisfied.

In some embodiments, the threshold frequency is a second threshold frequency. The copying the data stored in the memory cells associated with the normal word line subject to a row hammer effect into the memory cells associated with the hot word line before a condition is satisfied includes copying the data stored in the memory cells associated with the normal word line only if a first condition, of the access frequency of the normal word line reaching a first threshold frequency less than the second frequency, is satisfied.

In some embodiments, the method further includes establishing the mapping relationship between the logical address and a hot physical address only if the first condition is satisfied.

In some embodiments, the accessing, based on the logical address, the hot word line associated with the copied data only if the condition is satisfied includes accessing the hot word line based on a hot physical address of the hot word line only if the condition is satisfied and a mapping relationship between the logical address and the hot physical address is present.

In some embodiments, the accessing, based on the logical address, the hot word line associated with the copied data only if the condition is satisfied includes accessing the hot word line based on a hot physical address of the hot word line only if a mapping relationship between the logical address and the hot physical address is present and the condition is satisfied.

In some embodiments, the method further includes determining whether the access frequency of the normal word line reaches one of the first threshold frequency and the second threshold frequency by detecting the logical address and counting how many times the logical address has been detected.

In the present disclosure, all of data stored in memory cells associated with normal word lines which has been accessed frequently are copied from a normal area to a hot area. Therefore, when a user requires the data, a control device will access hot word lines in the hot area, instead of the normal word lines in the normal area. The normal word lines subject to a row hammer effect are no longer accessed. As a result, the normal word lines, which would otherwise be subject to a row hammer effect, no longer suffer from a row hammer effect. A row hammer effect in the normal area is alleviated or eliminated without increasing a refresh rate of the DRAM on the normal word lines or limiting number of accesses.

Moreover, a portion of an access operation performed on the hot word line is similar to the refresh operation. As mentioned above, when the refresh operation is performed on the hot word line in the hot area frequently, the hot word line has relatively good ability to resist a row hammer effect. Since access frequency of all of the hot word lines in the hot area is relatively high, all of the hot word lines in the hot area have relatively good ability to resist a row hammer effect.

In some comparative approaches, a row hammer effect may be alleviated or eliminated by limiting number of accesses on a word line of a DRAM in a given period. For example, the number of accesses of the word line is limited to less than 300,000 accesses in a given period. As a result, the word line is not subject to a row hammer effect. However, a relatively low number of accesses may be accompanied by a relatively low performance of the DRAM.

Alternatively, in some comparative approaches, a row hammer effect may be alleviated or eliminated by increasing a refresh rate of a DRAM. In further detail, to refresh memory cells of the DRAM, in a refresh operation, a data will be read from the memory cells and subsequently written back to the memory cells, so as to avoid losing the data. When the refresh rate is relatively high, the refresh operation is performed a relatively large number of times in a period, which ensures that a data in the present timing is the same as that in the previous timing. That is, it is ensured that the data is not subject to flip. As a result, an ability to resist a row hammer effect is relatively good. However, the DRAM will consume more power when the refresh rate is relatively high.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
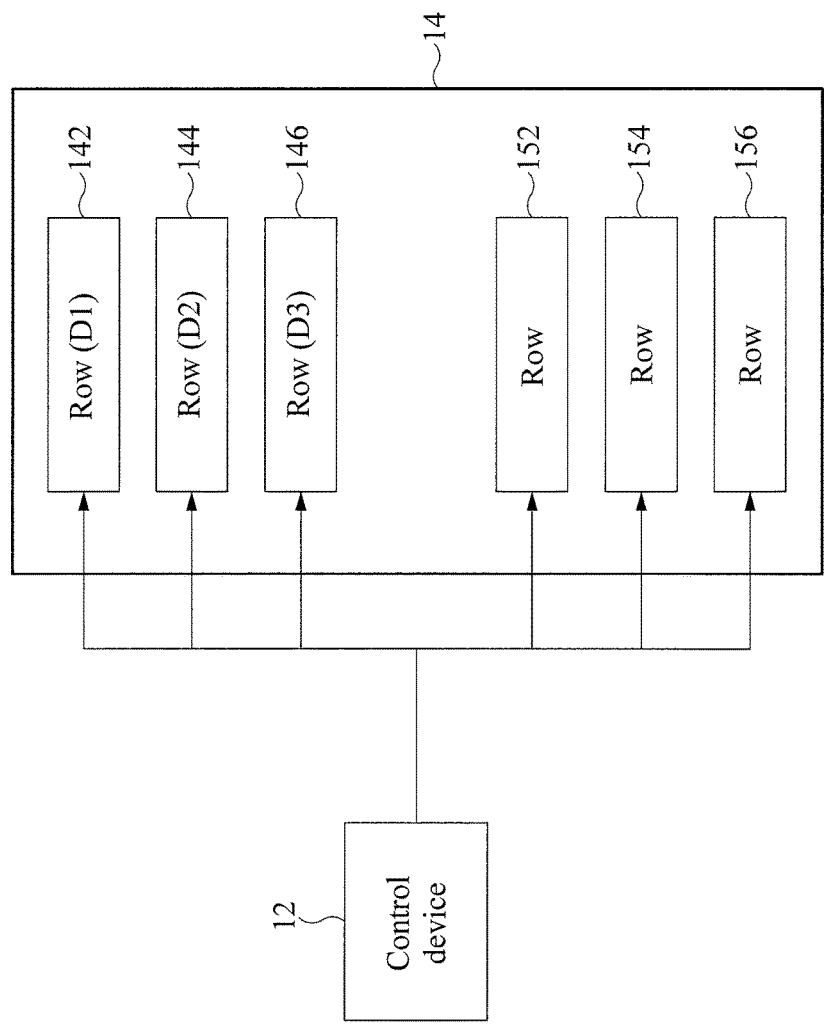
FIG. 1 is a schematic diagram of a comparative dynamic random access memory (DRAM).

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a comparative dynamic random access memory (DRAM) 10. Referring to FIG. 1, the DRAM 10 includes a control device 12, and a storage area 14 including a plurality of word lines (or, named row) 142, 144, 146, 152, 154 and 156.

The control device 12 functions to control access of the word lines 142, 144, 146, 152, 154 and 156, so as to, for example, read or write data stored in memory cells associated with the word lines 142, 144, 146, 152, 154 and 156.

Each of the word lines 142, 144, 146, 152, 154 and 156 controls memory cells associated with it. The word line 142 is immediately adjacent to the word line 144, which is in turn immediately adjacent to the word line 146. The word line 146 is immediately adjacent to the word line 152, which is in turn immediately adjacent to the word line 154. The word line 154 is immediately adjacent to the word line 156.

In operation, when a word line, such as any of the word lines 142, 144, 146, 152, 154 and 156, has been accessed more than, for example, about 300,000 times in a given period, the word line is subject to a row hammer effect, i.e. a row hammer effect may occur. To facilitate the better understanding of the row hammer effect, assume that memory cells associated with the word line 142 store a data D1; memory cells associated with the word line 144 store a data D2; and memory cells associated with the word line 146 store a data D3 as shown in FIG. 1. As previously mentioned, the word line 142 and the word line 146 are immediately adjacent to the word line 144. Therefore, if the word line 144 is accessed more than, for example, about 300,000 times in a given period, the data D1 and D3 may be flipped without accessing the word lines 142 and 146. For example, the data is flipped from logic level high to logic level low, and vice versa, which will be described in detail with reference to FIGS. 2 and 3. Such circumstance is called a row hammer effect. Since such flip is not intended, such flip may lead to the DRAM 10 working abnormally, or providing the wrong data.

Figure 2:
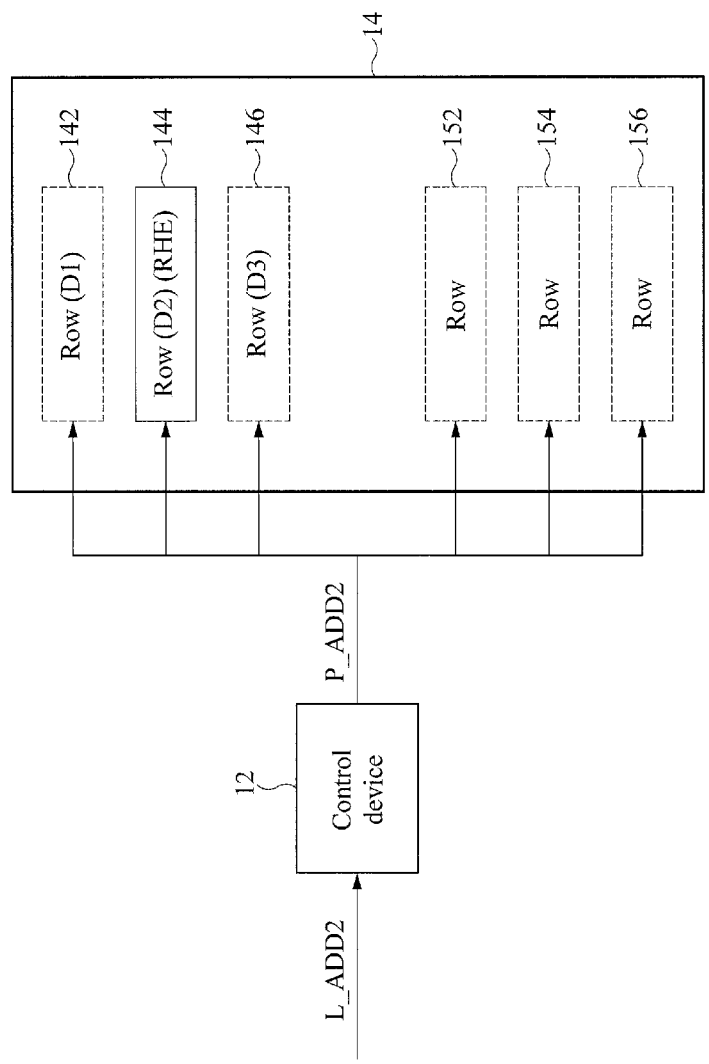
FIG. 2 is a schematic diagram illustrating an operation of the comparative DRAM shown in FIG. 1.

FIG. 2 is a schematic diagram illustrating an operation of the comparative DRAM 10 shown in FIG. 1. Referring to FIG. 2, the control device 12 receives a logical address L_ADD2, derives a physical address P_ADD2 based on the logical address L_ADD2, and accesses the word line 144 based on the physical address P_ADD2. The control device 12 has received the logical address L_ADD2 many times, for example, over about 300,000 times in a given period. Therefore, it is determined that the control device 12 accessed the word line 144 over, for example, 300,000 times in a given period. As a result, the word line 144 is subject to a row hammer effect RHE.

Figure 3:
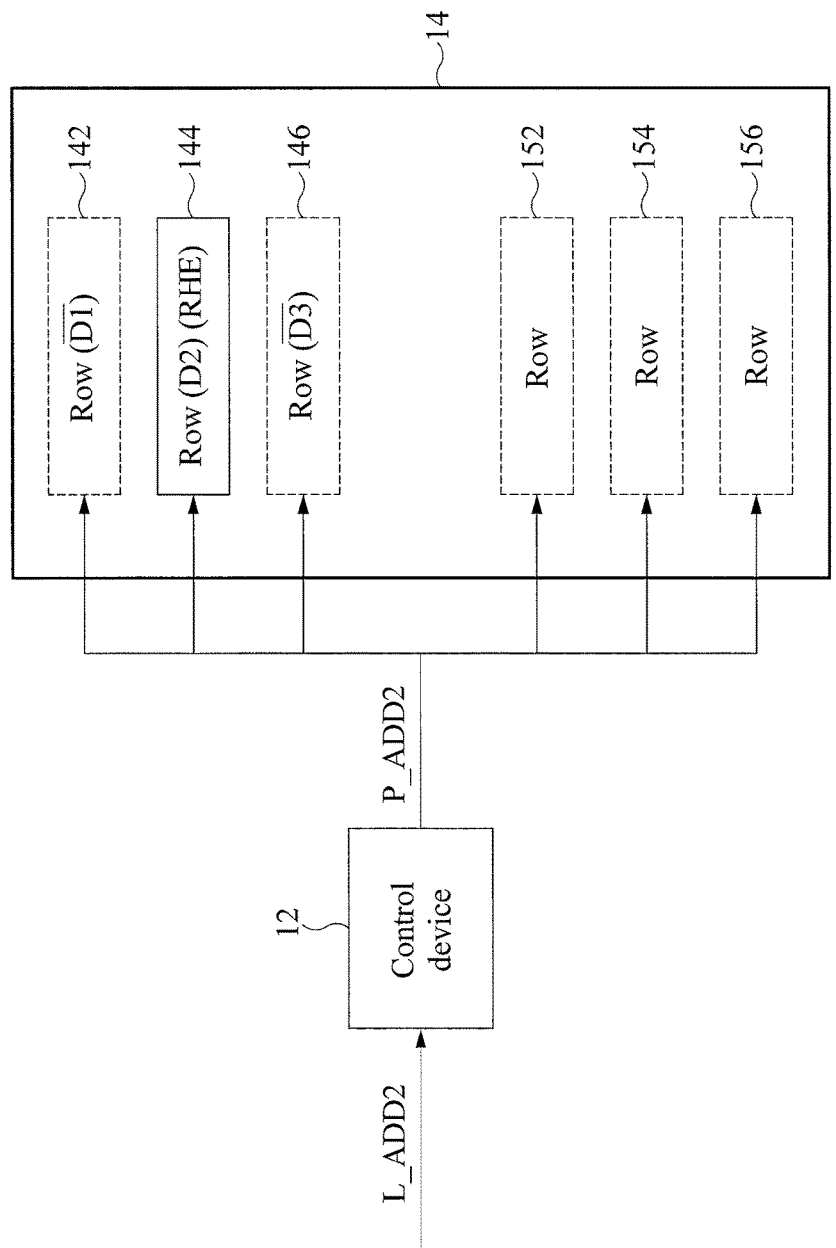
FIG. 3 is a schematic diagram illustrating a row hammer effect occurs on the word line shown in FIG. 1.

FIG. 3 is a schematic diagram illustrating a row hammer effect occurs on the word line 144 shown in FIG. 1. Referring to FIG. 3, a row hammer effect occurs. Data stored in the memory cells associated with the word line 142 is flipped from the data D1 to a data $\overline{D1}$, wherein a voltage level of the data D1 is opposite to that of the data $\overline{D1}$. Similarly, data stored in the memory cells associated with the word line 146 is flipped from the data D3 to a data $\overline{D3}$, wherein a voltage level of the data D3 is opposite to that of the data $\overline{D3}$. The flip from the data D1 to the data $\overline{D1}$ does not imply that all of bits associated with the word line 142 are changed. In some circumstances, only some bits are changed. Similarly, the flip from the data D3 to the data $\overline{D3}$ does not imply that all of bits associated with the word line 146 are changed. In some circumstances, only some bits are changed.

In some existing approaches, a row hammer effect may be alleviated or eliminated by limiting number of accesses of a word line in a given period. For example, the number of accesses of the word line 144 is limited to less than 300,000 times in a given period. As a result, the word line 144 is not subject to a row hammer effect. However, a relatively low number of accesses may be accompanied by a relatively low performance of the DRAM 10.

Alternatively, a row hammer effect may be alleviated or eliminated by increasing a refresh rate of the DRAM 10. In further detail, to refresh memory cells, in a refresh operation, a data will be read from the memory cells and subsequently written back to the memory cells, so as to avoid losing the data. When the refresh rate is relatively high, the refresh operation is performed a relatively large number of times in a given period, which ensures that a data in the present timing is the same as that in the previous timing. That is, it is ensured that the data is not subject to flip. As a result, an ability to resist a row hammer effect is relatively good. However, the DRAM 10 will consume more power when the refresh rate is relatively high.

Figure 4:
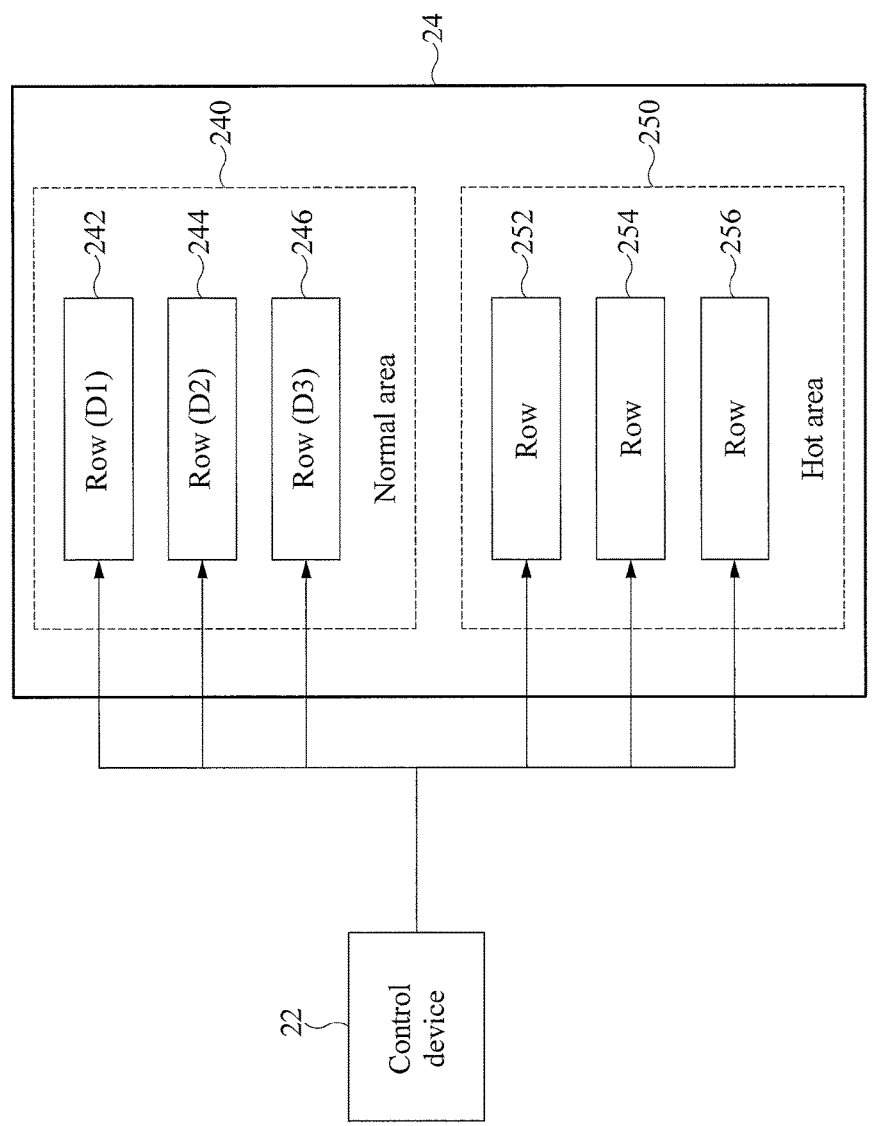
FIG. 4 is a schematic diagram of a dynamic random access memory (DRAM) which includes a control device, in accordance with some embodiments of the present disclosure.

FIG. 4 is a schematic diagram of a dynamic random access memory (DRAM) 20 with a control device 22, in accordance with some embodiments of the present disclosure. The DRAM 20 includes a control device 22 and a storage area 24 controllable by the control device 22.

The storage area 24 is configured into a normal area 240 and a hot area 250. The normal area 240 functions to store data. The hot area 250 functions to store copied data copied from the normal area 240, as described in detail below. In an embodiment, a word line of the hot area 250, which is immediately adjacent to a word line of the normal area 240, is not used to store data. In another embodiment, although the normal area 240 is depicted to be immediately adjacent to the hot area 250, the normal area 240 and the hot area 250 are spaced apart from each other by a distance sufficient to allow word lines of the normal area 240 and word lines of the hot area 250 to be not affected by each other. An access frequency of the hot area 250 is greater than that of the normal area 240.

The normal area 240 includes a plurality of normal word lines 242, 244 and 246, and a plurality of memory cells (not shown) controllable by the associated normal word line among the normal word lines 242, 244 and 246. The memory cells function to store the data. In further detail, memory cells associated with the word line 242 store a data D1; memory cells associated with the word line 244 store a data D2; and memory cells associated with the word line 246 store a data D3.

The hot area 250 includes a plurality of hot word lines 252, 254 and 256, and a plurality of memory cells (not shown) controllable by the associated hot word line among the hot word lines 252, 254 and 256. The memory cells function to store the copied data copied from the normal area 240.

The control device 22 functions to detect a logical address, and controls accesses of the normal word lines 242, 244 and 246, and the hot word lines 252, 254 and 256 based on the logical address, as described in detail below.

In an embodiment, the control device 22 includes a combinational logic. In an embodiment, the control device 22 is implemented with a hardware, a software, or a combination thereof. Although in the present embodiment, the control device 22 is within the DRAM 20, the present disclosure is not limited thereto. In some embodiments, the control device 22 includes a processor external to the DRAM 20.

Figure 5:
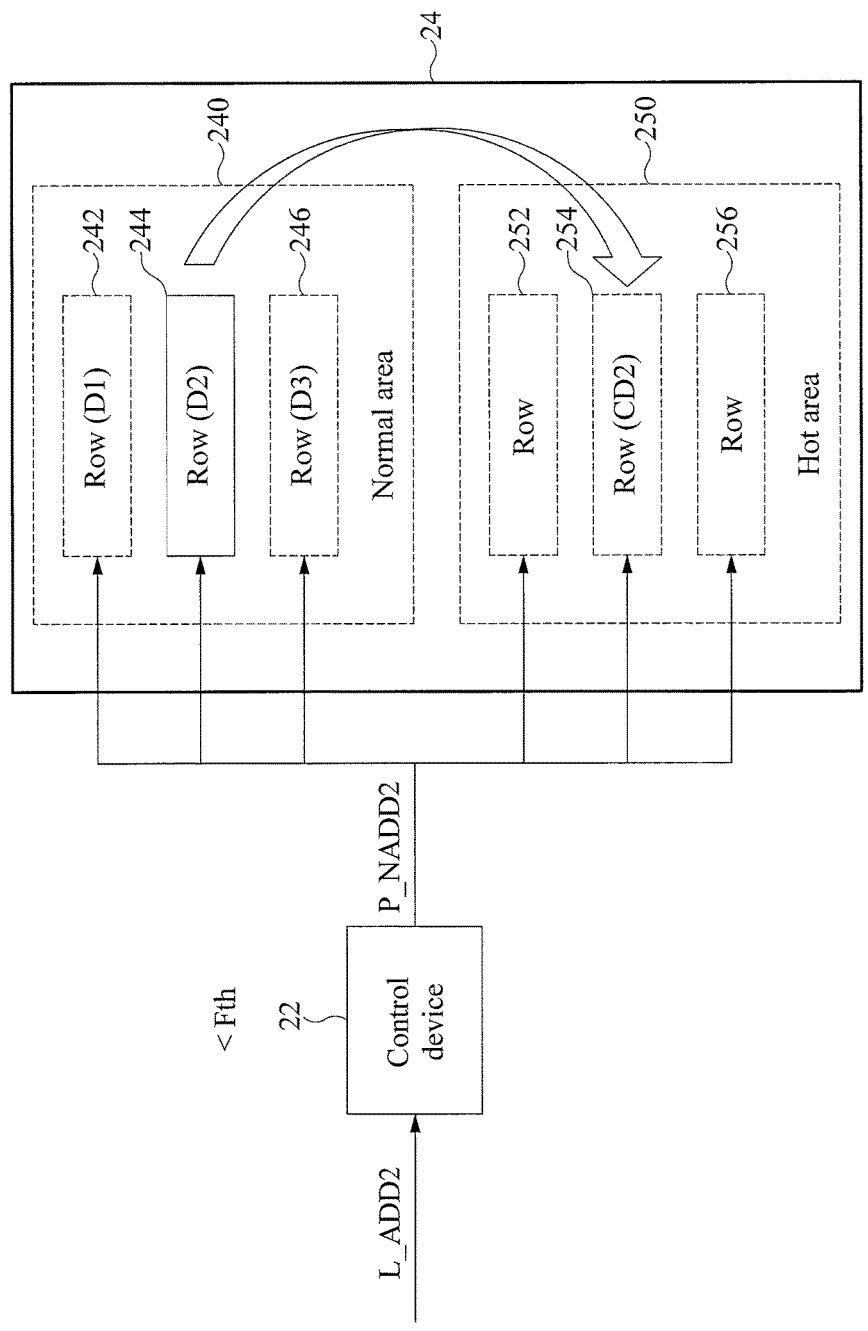
FIG. 5 is a schematic diagram illustrating an operation of the DRAM shown in FIG. 4 in a circumstance that an access frequency of a normal word line subject to a row hammer effect does not reach a threshold frequency, in accordance with some embodiments of the present disclosure.
Figure 6:
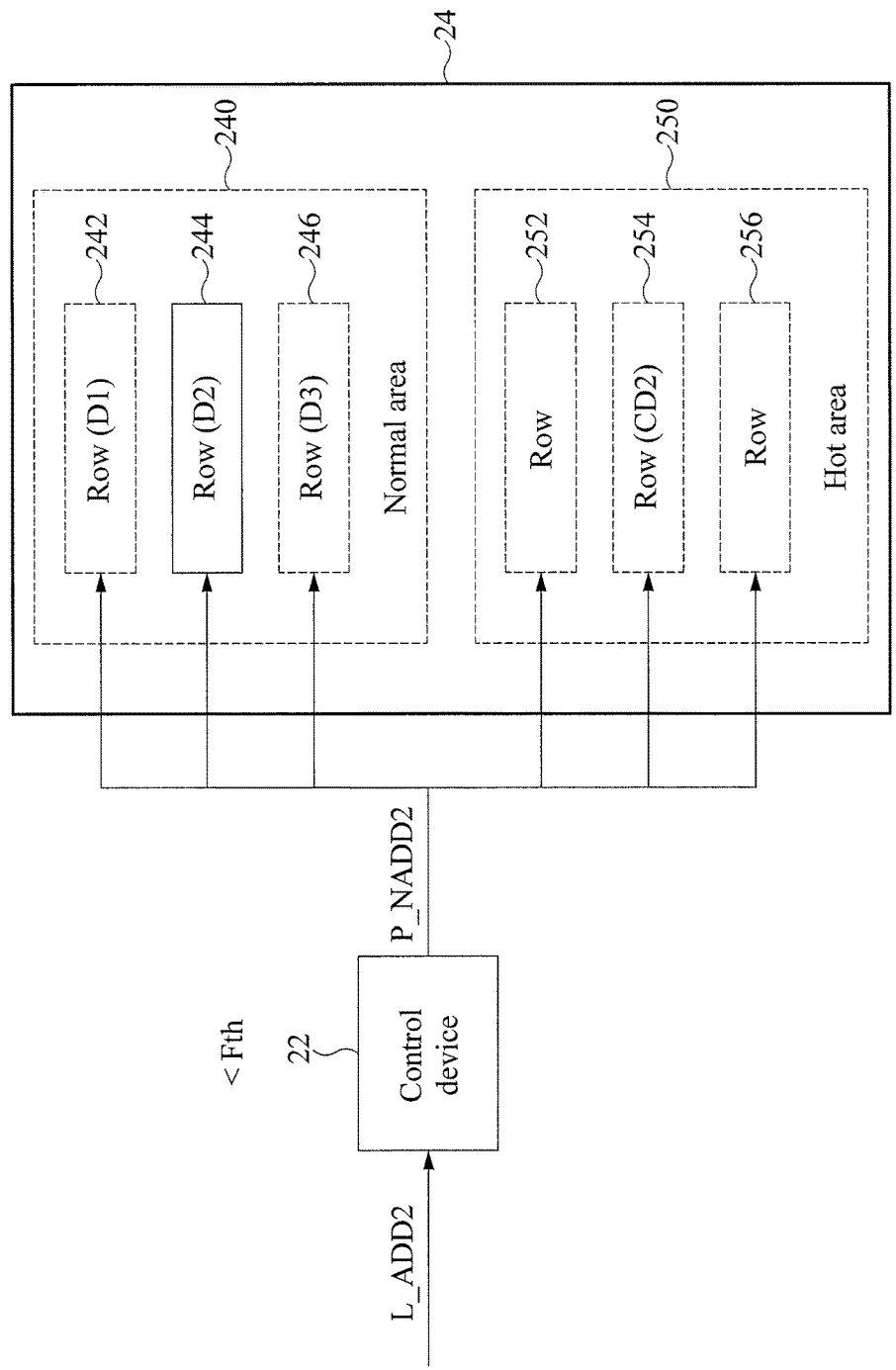
FIG. 6 is a schematic diagram illustrating another operation of the DRAM shown in FIG. 4 in a circumstance that an access frequency of a normal word line subject to a row hammer effect does not reach a threshold frequency, in accordance with some embodiments of the present disclosure.
Figure 7:
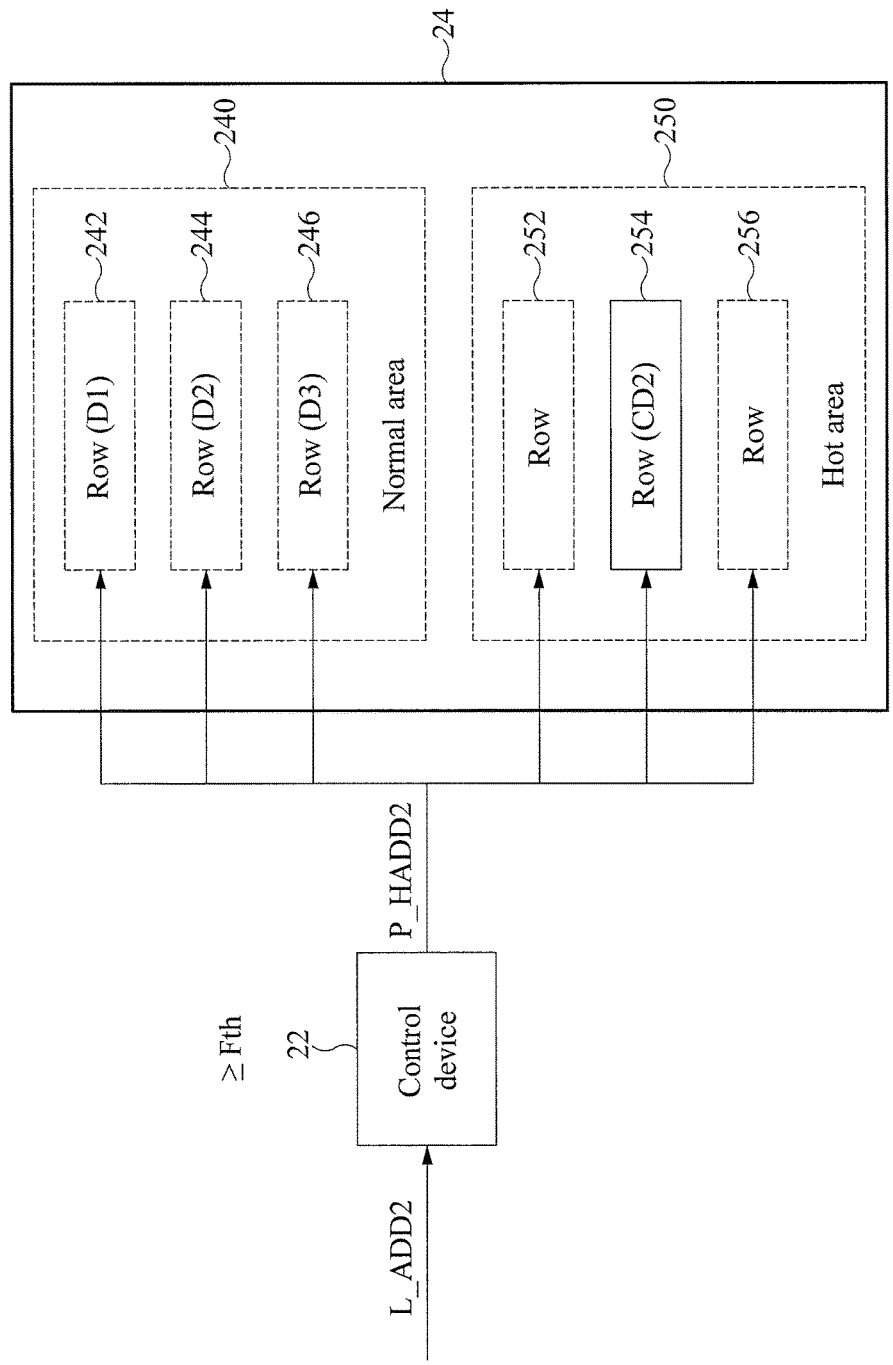
FIG. 7 is a schematic diagram illustrating an operation of the DRAM shown in FIG. 4 in a circumstance that an access frequency of a normal word line subject to a row hammer effect reaches a threshold frequency, in accordance with some embodiments of the present disclosure.
Figure 8:
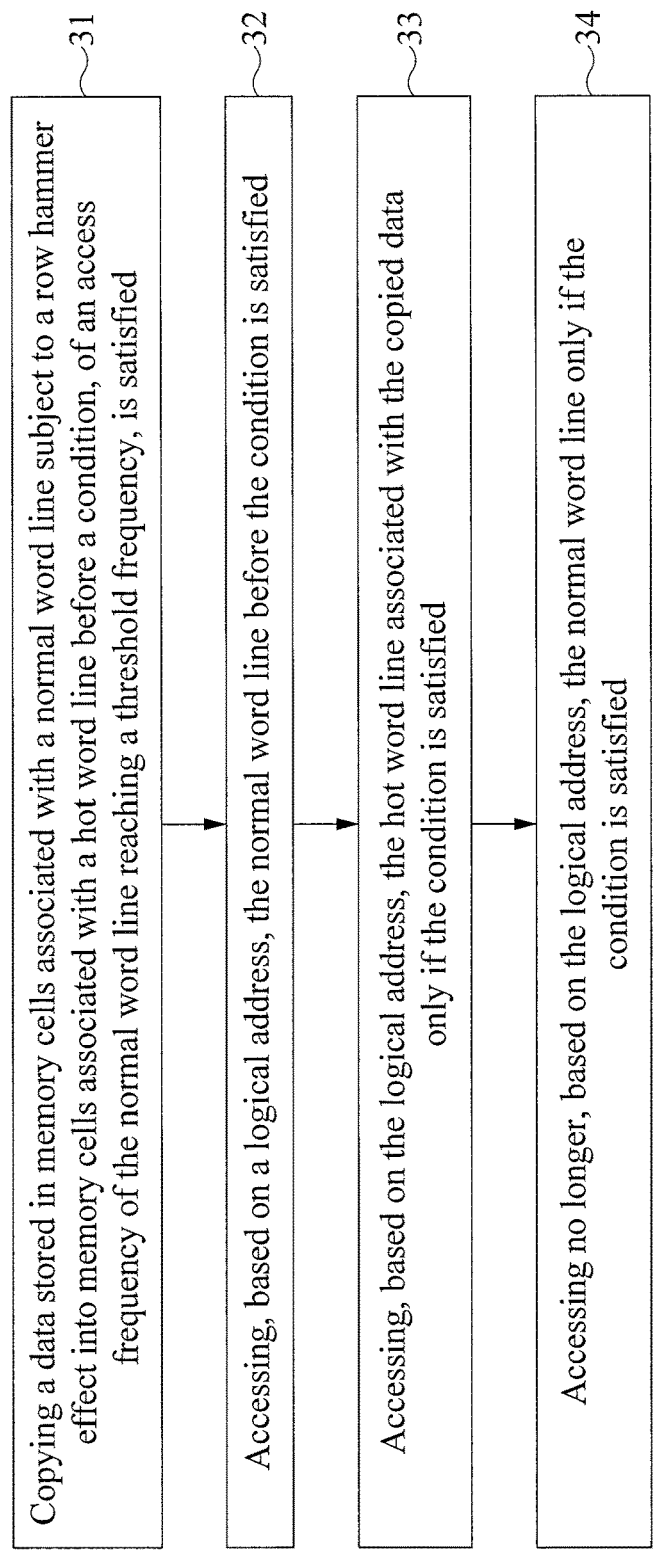
FIG. 8 is a schematic diagram illustrating an operation of the DRAM shown in FIG. 4, in accordance with some embodiments of the present disclosure.

FIG. 5 is a schematic diagram illustrating an operation of the DRAM 20 shown in FIG. 4 in a circumstance that an access frequency of the normal word line 244 subject to a row hammer effect does not reach a threshold frequency, in accordance with some embodiments of the present disclosure. FIG. 6 is a schematic diagram illustrating another operation of the DRAM 20 shown in FIG. 4 in a circumstance that an access frequency of the normal word line 244 subject to a row hammer effect does not reach the threshold frequency, in accordance with some embodiments of the present disclosure. FIG. 7 is a schematic diagram illustrating an operation of the DRAM 20 shown in FIG. 4 in a circumstance that an access frequency of the normal word line 244 subject to a row hammer effect reaches the threshold frequency, in accordance with some embodiments of the present disclosure. FIG. 8 is a flow diagram illustrating a method 30 of operating a storage area of a DRAM 20, in accordance with some embodiments of the present disclosure. Referring to FIG. 8, accompanied by FIGS. 5, 6 and 7, the method 30 includes operations 31, 32, 33 and 34.

The method 30 begins with operation 31. In operation 31, referring to FIG. 5, an access frequency of the normal word line 244 subject to a row hammer effect does not reach a threshold frequency Fth. The control device 22 copies the data D2, stored in memory cells associated with the normal word line 244 subject to a row hammer effect, into memory cells associated with the hot word line 254 before a condition, of an access frequency of the normal word line 244 reaching a threshold frequency, is satisfied.

The method 30 continues with operation 32. In operation 32, referring to FIG. 6, the access frequency of the normal word line 244 does not reach the threshold frequency Fth. The control device 22 detects the logical address L_ADD2. Moreover, the control device 22 derives a normal physical address P_NADD2 based on the logical address L_ADD2, and accesses, based on the normal physical address P_NADD2 derived from the logical address L_ADD2, the normal word line 244 before the condition is satisfied.

The method 30 proceeds to operation 33. In operation 33, referring to FIG. 7, the access frequency of the normal word line 244 reaches the threshold frequency Fth. The control device 22 derives a hot physical address P_HADD2 based on the logical address L_ADD2, and accesses, based on the hot physical address P_HADD2 derived from the logical address L_ADD2, the hot word line 254 associated with the copied data only if the condition is satisfied.

The method 30 proceeds to operation 34. In operation 34, referring to FIG. 7, the access frequency of the normal word line 244 reaches the threshold frequency Fth. The control device 22 no longer accesses, based on the logical address logical address L_ADD2, the normal word line 244 only if the condition is satisfied.

The method 30 can apply to any of the remaining normal word lines 242 and 246. Taking the normal word line 242 for instance, when the normal word line 242 is a normal word line subject to a row hammer effect, the control device 22 copies the data D1 into memory cells associated with, for example, the hot word line 252. The control device 22 accesses the hot word line 252 and no longer accesses the normal word line 242 only if the condition is satisfied.

In the present disclosure, all of data stored in memory cells associated with normal word lines which has been accessed frequently are copied from the normal area 240 to the hot area 250. Hot word lines in the hot area 250 replace the normal word lines subject to a row hammer effect to be accessed only if the condition is satisfied. For example, when a user requires the data, the control device 22 will access hot word lines in the hot area 250, instead of the normal word lines in the normal area 240, only if the condition is satisfied. The normal word lines subject to a row hammer effect are no longer accessed only if the condition is satisfied. As a result, the normal word lines, such as the normal word line 244, which would otherwise be subject to a row hammer effect, no longer suffer from a row hammer effect. A row hammer effect in the normal area 240 is alleviated or even eliminated without increasing a refresh rate on the normal word line 244 or limiting number of accesses.

Moreover, a portion of an access operation performed on the hot word line is similar to the refresh operation previously mentioned. As discussed above, when the refresh operation is performed on the hot word line in the hot area 250 frequently, the hot word line has relatively good ability to resist a row hammer effect. Since access frequency of all of the hot word lines in the hot area 250 is relatively high, all of the hot word lines in the hot area 250 have relatively good ability to resist a row hammer effect.

Figure 9:
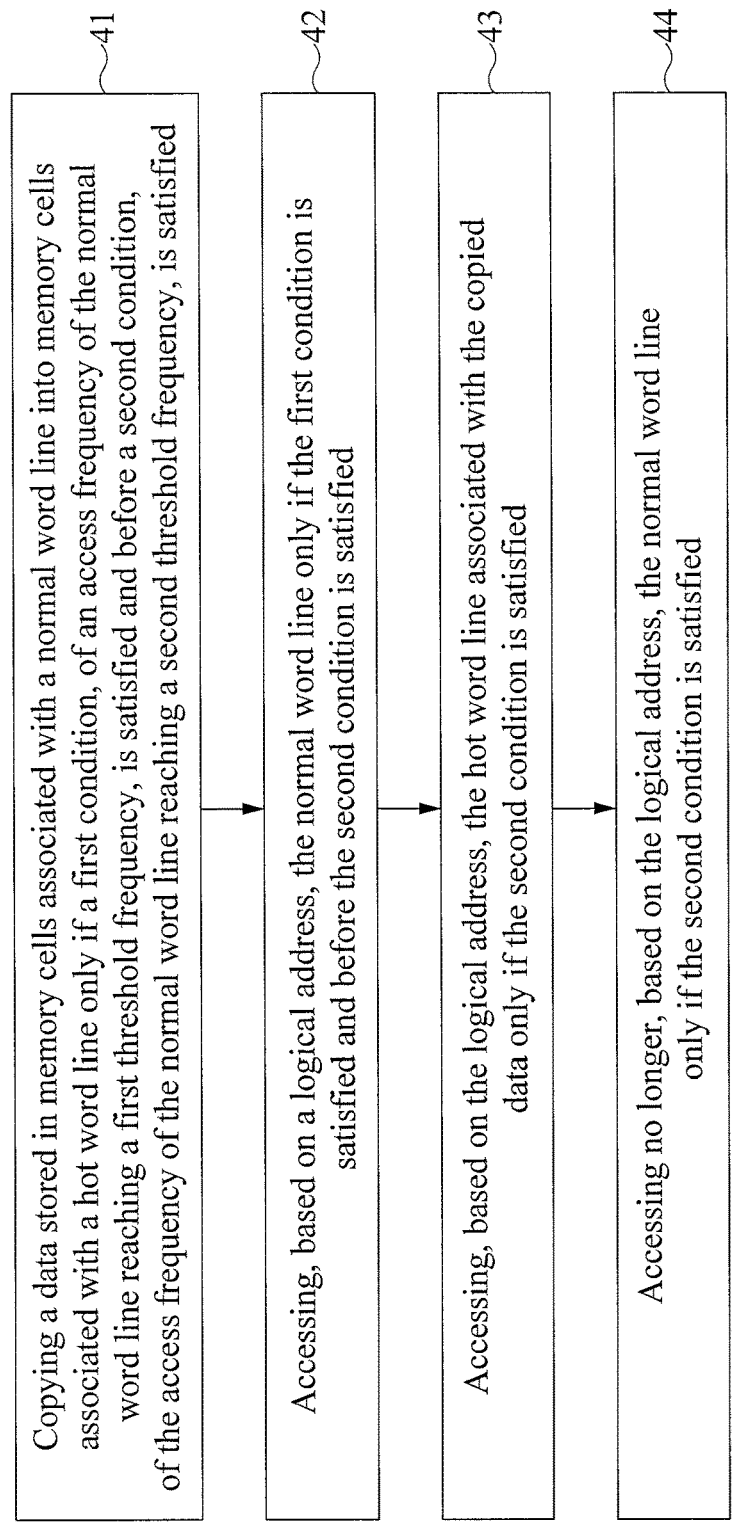
FIG. 9 is a flow diagram illustrating another method of operating a storage area of a DRAM, in accordance with some embodiments of the present disclosure.

FIG. 9 is a flow diagram illustrating a method 40 of operating a storage area of a DRAM 20, in accordance with some embodiments of the present disclosure. The method 40 is similar to the method 30 described and illustrated with reference to FIG. 8 except that, for example, whether a normal word line is subject to a row hammer effect can be evaluated by determining whether an access frequency achieves a first threshold frequency. If the access frequency of the normal word line achieves the first threshold frequency, the normal word line is determined to be a normal word line subject to a row hammer effect. If not, the normal word line is determined to be a normal word line not subject to a row hammer effect.

Referring to FIG. 9, accompanied by FIGS. 5, 6 and 7, the method 40 includes operations 41, 42, 43 and 44. The method 40 begins with operation 41, in which, referring to FIG. 5, the control device 22 copies the data D2 stored in memory cells associated with the normal word line 244 into memory cells associated with the hot word line only 254 if a first condition, of an access frequency of the normal word line 244 reaching a first threshold frequency, is satisfied and before a second condition, of the access frequency of the normal word line 244 reaching a second threshold frequency greater than the first threshold frequency, is satisfied.

The method 40 proceeds to operation 42, in which, referring to FIG. 6, the control device 22 accesses, based on the logical address L_ADD2, the normal word line 224 only if the first condition is satisfied and before the second condition is satisfied.

The method 40 proceeds to operation 43, in which, referring to FIG. 7, the control device 22 accesses, based on the logical address L_ADD2, the hot word line 254 associated with the copied data only if the second condition is satisfied.

The method 40 proceeds to operation 44, in which, referring to FIG. 7, the control device 22 no longer accesses, based on the logical address L_ADD2, the normal word line 244 only if the second condition is satisfied.

In the present disclosure, all of data stored in memory cells associated with normal word lines are copied from the normal area 240 to the hot area 250 only if an access frequency of the normal word lines reaches the first threshold frequency. Hot word lines in the hot area 250 replace the normal word lines subject to be accessed only if the access frequency of the normal word lines reaches the second threshold frequency. The normal word lines subject to a row hammer effect are no longer accessed only if the second condition is satisfied. As a result, the normal word lines, such as the normal word line 244, which would otherwise be subject to a row hammer effect, no longer suffer from a row hammer effect. A row hammer effect in the normal area 240 is alleviated or even eliminated without increasing a refresh rate on the normal word line 244 or limiting number of accesses.

Moreover, a portion of an access operation performed on the hot word line is similar to the refresh operation previously mentioned. As discussed above, when the refresh operation is performed on the hot word line in the hot area 250 frequently, the hot word line has relatively good ability to resist a row hammer effect. Since access frequency of all of the hot word lines in the hot area 250 is relatively high, all of the hot word lines in the hot area 250 have relatively good ability to resist a row hammer effect.

Figure 10:
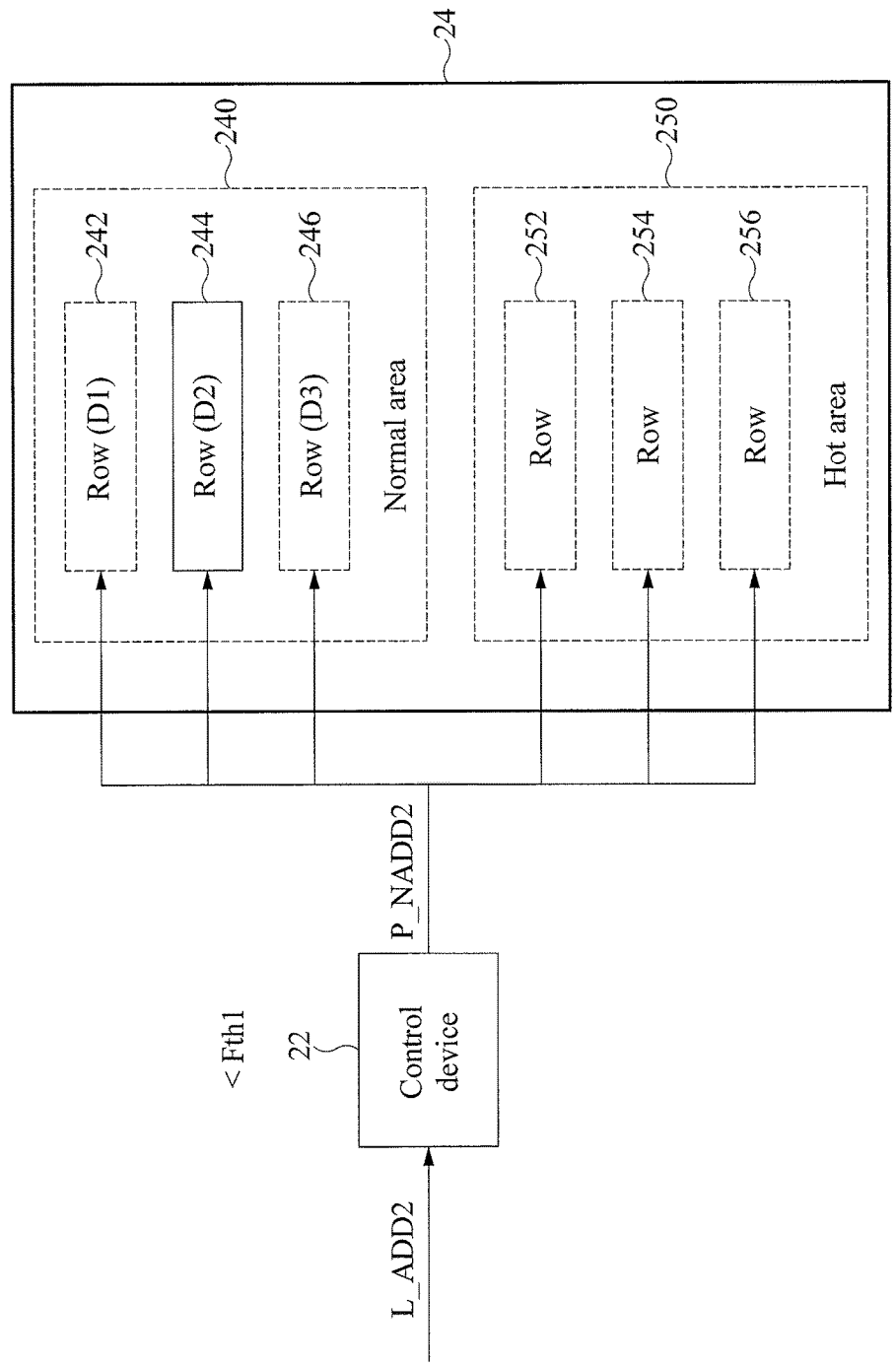
FIG. 10 is a schematic diagram illustrating an operation of the DRAM shown in FIG. 4 in a circumstance that a mapping relationship is not present and an access frequency of a normal word line does not reach a first threshold frequency, in accordance with some embodiments of the present disclosure.
Figure 11:
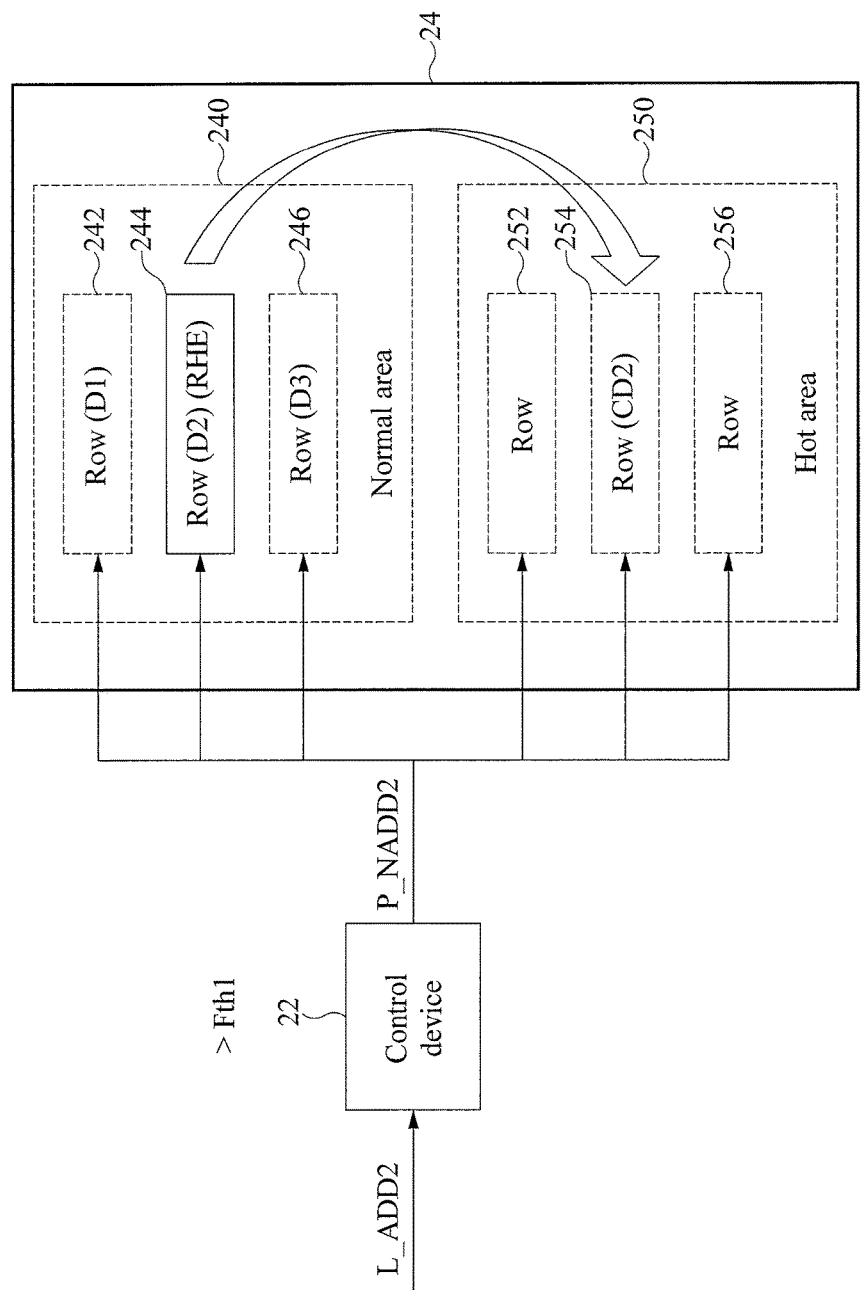
FIG. 11 is a schematic diagram illustrating an operation of the DRAM shown in FIG. 4 in another circumstance that a mapping relationship is not present and an access frequency of a normal word line reaches a first threshold frequency, in accordance with some embodiments of the present disclosure.
Figure 12:
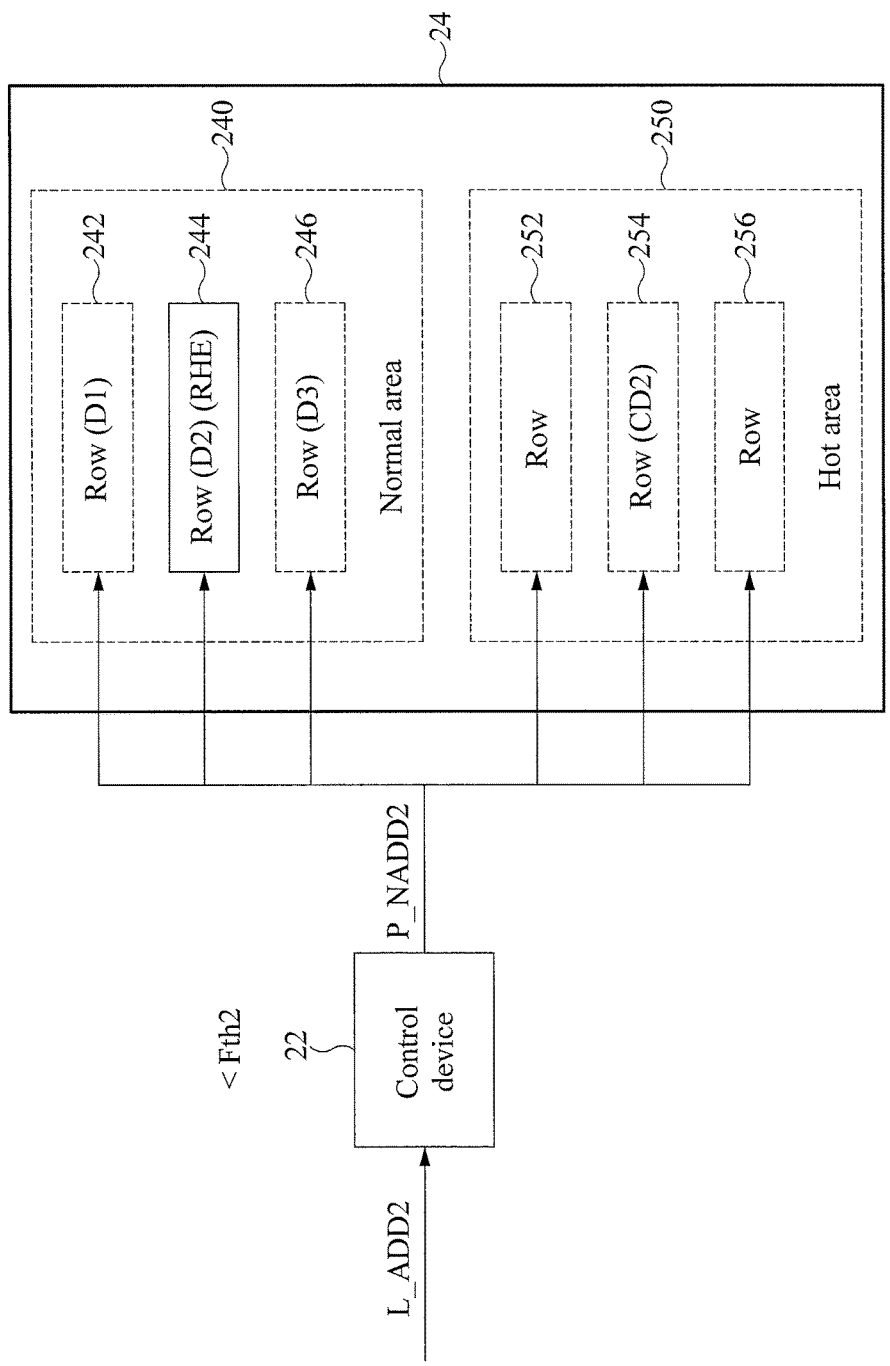
FIG. 12 is a schematic diagram illustrating an operation of the DRAM shown in FIG. 4 in yet another circumstance that a mapping relationship is present and an access frequency of a normal word line does not reach a second threshold frequency, in accordance with some embodiments of the present disclosure.
Figure 13:
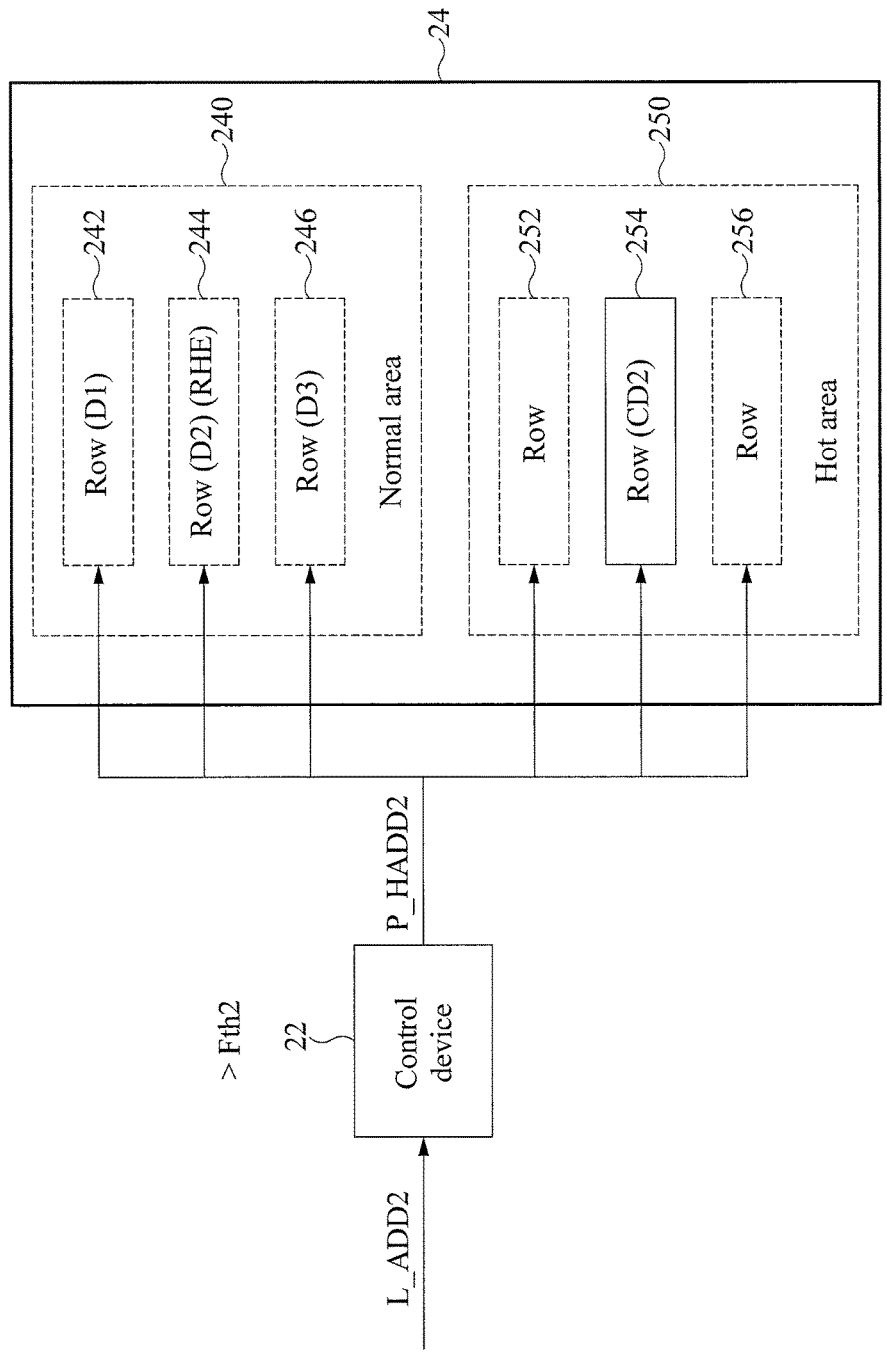
FIG. 13 is a schematic diagram illustrating an operation of the DRAM shown in FIG. 4 in further yet another circumstance that a mapping relationship is present and an access frequency of a normal word line reaches a second threshold frequency, in accordance with some embodiments of the present disclosure.
Figure 14:
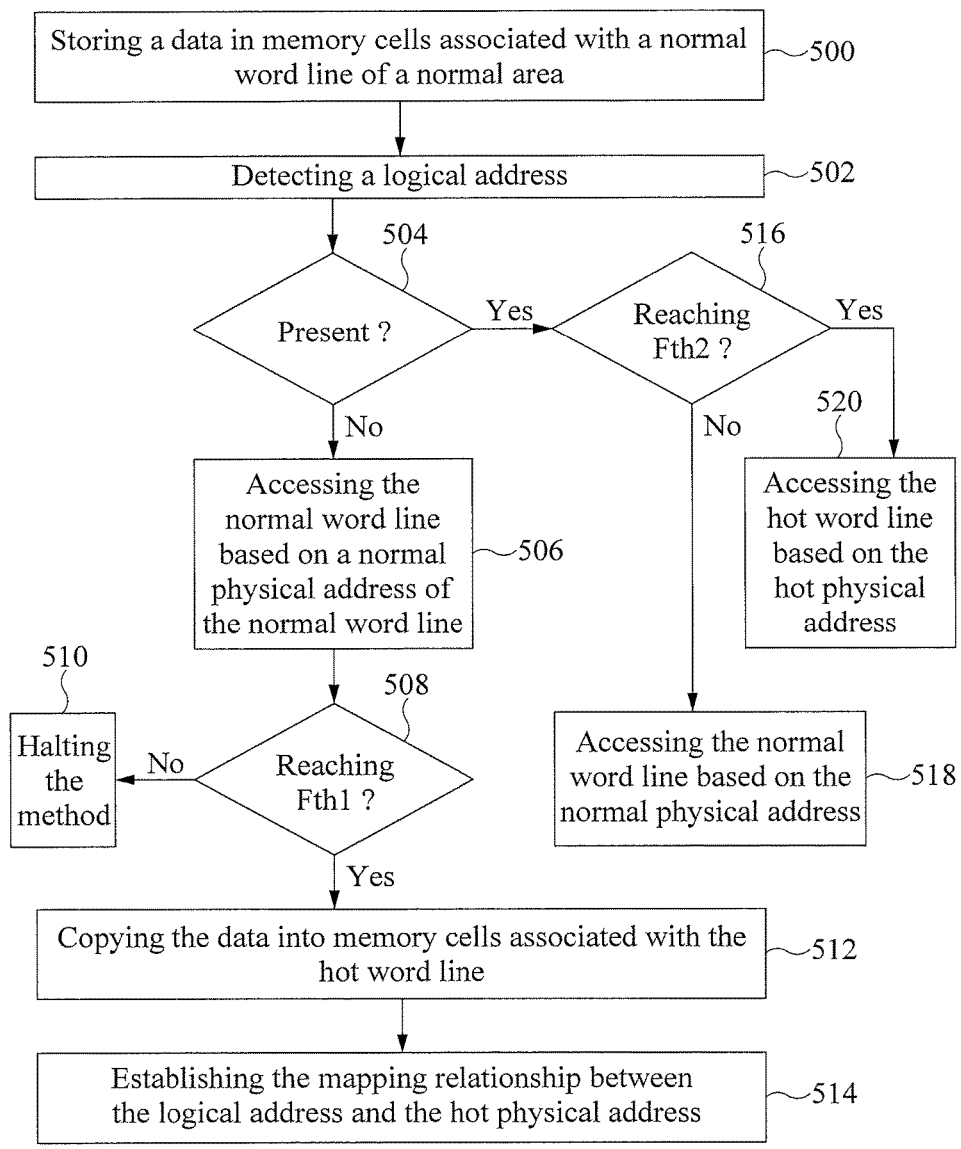
FIG. 14 is a flow diagram illustrating yet another method of operating a storage area of a DRAM, in accordance with some embodiments of the present disclosure.

FIG. 10 is a schematic diagram illustrating an operation of the DRAM 20 shown in FIG. 4 in a circumstance that a mapping relationship is not present and an access frequency of the normal word line 244 does not reach a first threshold frequency Fth1, in accordance with some embodiments of the present disclosure. FIG. 11 is a schematic diagram illustrating an operation of the DRAM 20 shown in FIG. 4 in another circumstance that the mapping relationship is not present and the access frequency of the normal word line 244 reaches the first threshold frequency Fth1, in accordance with some embodiments of the present disclosure. FIG. 12 is a schematic diagram illustrating an operation of the DRAM 20 shown in FIG. 4 in yet another circumstance that the mapping relationship is present and the access frequency of the normal word line 244 does not reach a second threshold frequency Fth2, in accordance with some embodiments of the present disclosure. FIG. 13 is a schematic diagram illustrating an operation of the DRAM 20 shown in FIG. 4 in further yet another circumstance that the mapping relationship is present and the access frequency of the normal word line 244 reaches the second threshold frequency Fth2, in accordance with some embodiments of the present disclosure. FIG. 14 is a flow diagram illustrating yet another method 50 of operating the storage area 24 of the DRAM 20 shown in FIG. 4, in accordance with some embodiments of the present disclosure.

Referring to FIG. 14, accompanied by the FIGS. 10, 11, 12 and 13, the method 50 includes operations 500, 502, 504, 506, 508, 510, 512, 514, 516, 518 and 520.

The method 50 begins with operation 500, in which memory cells associated with the normal word line 244 of the normal area 240 store a data D2. The method 50 proceeds to operation 502, in which the control device 22 detects a logical address L_ADD2, and counts how many times the logical address L_ADD2 has been received in a period.

In an embodiment, whether a normal word line is subject to a row hammer effect can be evaluated by counting how many times a logical address has been detected in a period so as to determine an access frequency of the normal word line. As a result, an access frequency of the normal word line 244 can be determined based on the count.

Referring to FIG. 10, the method 50 proceeds to operation 504, in which the control device 22 determines whether a mapping relationship between the logical address L_ADD2 and a hot physical address of a hot word line in the hot area 250 is present. As mentioned above, in the embodiment of FIG. 10, the mapping relationship is not present. As a result, the method 50 proceeds to operation 506, in which the control device 22 accesses the normal word line 244 based on a normal physical address P_NADD2 of the normal word line 244. In further detail, since the mapping relationship is not present, the control device 22 derives the normal physical address P_NADD2 based on a mapping relationship between the logical address L_ADD2 and the normal physical address P_NADD2.

Subsequent to operation 506, in operation 508, the control device 22 determines whether the access frequency of the normal word line 244 reaches the first threshold frequency Fth1 based on the logical address L_ADD2. As mentioned above, in the embodiment of FIG. 10, the access frequency of the normal word line 244 does not reach the first threshold frequency Fth1. As a result, the method 50 proceeds to operation 510, in which the method 50 is halted.

Referring to FIG. 11, operations 500, 502, 504 and 506 are the same as that described in the embodiment of FIG. 10. Therefore, the detailed descriptions are omitted herein. In operation 508, the control device 22 determines that the access frequency of the normal word line 244 reaches the first threshold frequency Fth1 based on the logical address L_ADD2. The method 50 proceeds to operation 512, in which the control device 22 copies the data D2 into memory cells associated with the hot word line 254. The copied data is labeled CD2. Subsequent to operation 512, in operation 514, the control device 22 establishes a mapping relationship between the logical address L_ADD2 and a hot physical address P_HADD2 of the hot word line 254.

Referring to FIG. 12, operations 500 and 502 are the same as that described in the embodiment of FIG. 10. Therefore, the detailed descriptions are omitted herein. As mentioned above, in the embodiment of FIG. 10, the mapping relationship between the logical address L_ADD2 and the hot physical address P_HADD2 is present. For example, before the circumstance described in the embodiment of FIG. 12 occurs, the access frequency of the normal word line 244 has already reached the first threshold frequency Fth1. As a result, the mapping relationship between the logical address L_ADD2 and the hot physical address P_HADD2 has been established. As such, in operation 504, the control device 22 determines that the mapping relationship is present. The method 50 proceeds to operation 516, in which the control device 22 determines whether the access frequency of the normal word line 244 reaches a second threshold frequency Fth2 greater than the first threshold frequency Fth1 based on the logical address L_ADD2. As mentioned above, in the embodiment of FIG. 12, the access frequency of the normal word line 244 does not reach the second threshold frequency Fth2. As a result, the method 50 proceeds to operation 518, in which the control device 24 still accesses the normal word line 244 based on the normal physical address P_NADD2.

Referring to FIG. 13, operations 500, 502 and 504 are the same as that described in the embodiment of FIG. 12. Therefore, the detailed descriptions are omitted herein. In operation 516, in which the control device 22 determines whether the access frequency of the normal word line 244 reaches the second threshold frequency Fth2 based on the logical address L_ADD2. As mentioned above, in the embodiment of FIG. 13, the access frequency of the normal word line 244 reaches the second threshold frequency Fth2. As a result, the method 50 proceeds to operation 520, in which the control device 22 accesses the hot word line 254 based on the hot physical address P_HADD2 derived from the mapping relationship between the logical address L_ADD2 and the hot physical address P_HADD2, and no longer accesses the normal word line 244. That is, when the access frequency of the normal word line 244 reaches the second threshold frequency Fth2, the control device 22 will ignore the mapping relationship between the logical address L_ADD2 and the normal physical address P_NADD2, and based on the mapping relationship between the logical address L_ADD2 and the hot physical address P_HADD2 accesses the hot word line 254.

In the present disclosure, all of data stored in memory cells associated with normal word lines are copied from the normal area 240 to the hot area 250 only if an access frequency of the normal word lines reaches the first threshold frequency. Hot word lines in the hot area 250 replace the normal word lines subject to be accessed only if the access frequency of the normal word lines reaches the second threshold frequency. The normal word lines subject to a row hammer effect are no longer accessed only if the second condition is satisfied. As a result, the normal word lines, such as the normal word line 244, which would otherwise be subject to a row hammer effect, no longer suffer from a row hammer effect. A row hammer effect in the normal area 240 is alleviated or even eliminated without increasing a refresh rate on the normal word line 244 or limiting number of accesses.

Moreover, a portion of an access operation performed on the hot word line is similar to the refresh operation previously mentioned. As discussed above, when the refresh operation is performed on the hot word line in the hot area 250 frequently, the hot word line has relatively good ability to resist a row hammer effect. Since access frequency of all of the hot word lines in the hot area 250 is relatively high, all of the hot word lines in the hot area 250 have relatively good ability to resist a row hammer effect.

In some existing approaches, a row hammer effect may be alleviated or eliminated by limiting number of accesses on a word line. For example, the number of accesses of the word line 144 is limited to less than 300,000 times in a given period. As a result, the word line 144 is not subject to a row hammer effect. However, a relatively low number of accesses may be accompanied by a relatively low performance of the DRAM 10.

Alternatively, a row hammer effect may be alleviated or eliminated by increasing a refresh rate of the DRAM 10. In further detail, to refresh memory cells, in a refresh operation, a data will be read from the memory cells and subsequently written back to the memory cells, so as to avoid losing the data. When the refresh rate is relatively high, the refresh operation is performed a relatively large number of times in a period, which ensures that a data in the present timing is the same as that in the previous timing That is, it is ensured that the data is not subject to flip. As a result, an ability to resist a row hammer effect is relatively good. However, the DRAM 10 will consume more power when the refresh rate is relatively high.

One aspect of the present disclosure provides a DRAM. The DRAM includes a storage area and a control device. The storage area includes a normal area and a hot area. The normal area includes a normal word line subject to a row hammer effect, and a plurality of memory cells controllable by the normal word line and configured to store a data. The hot area includes a hot word line, and a plurality of memory cells controllable by the hot word line. The control device copies the data stored in the memory cells associated with the normal word line into the memory cells associated with the hot word line before a condition is satisfied; accesses, based on a logical address, the normal word line before the condition is satisfied; accesses, based on the logical address, the hot word line associated with the copied data only if the condition is satisfied; and no longer accesses, based on the logical address, the normal word line only if the condition is satisfied. The condition includes an access frequency of the normal word line reaching a threshold frequency.

Another aspect of the present disclosure provides a method. The method includes copying a data stored in memory cells associated with a normal word line subject to a row hammer effect into memory cells associated with a hot word line before a condition is satisfied, wherein the condition includes an access frequency of the normal word line reaching a threshold frequency; accessing, based on a logical address, the normal word line before the condition is satisfied; accessing, based on the logical address, the hot word line associated with the copied data only if the condition is satisfied; and accessing no longer, based on the logical address, the normal word line only if the condition is satisfied.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
    a normal area including a plurality of memory cells controllable by a normal word line and configured to store a data;
    a hot area including a plurality of memory cells controllable by a hot word line;

a control device configured to copy the data stored in the memory cells associated with the normal word line which has been frequently accessed into the memory cells associated with the hot word line before a condition, of an access frequency of the normal word line reaching a first threshold frequency, is satisfied; to access the normal word line before the condition is satisfied; to access the hot word line associated with the copied data only if the condition is satisfied; to no longer access the data from the normal word line only if the condition is satisfied wherein the controller is further configured to access the normal word line if the access frequency of the normal word line does not reach a second threshold frequency; and to access the hot word line if the access frequency of the normal line reaches the second threshold frequency.

2. The DRAM of claim 1, wherein the control device copies the data stored in the memory cells associated with the normal word line only if a first condition, of the access frequency of the normal word line reaching the first threshold frequency less than the second threshold frequency, is satisfied.

3. The DRAM of claim 2, wherein the control device establishes a mapping relationship between the logical address and the hot physical address only if the first condition is satisfied.

4. The DRAM of claim 1, wherein the control device accesses the hot word line based on a hot physical address of the hot word line only if the condition is satisfied and a mapping relationship between the logical address and the hot physical address is present.

5. The DRAM of claim 1, wherein the control device accesses the hot word line based on a hot physical address of the hot word line only if a mapping relationship between the logical address and the hot physical address is present and the condition is satisfied.

6. The DRAM of claim 2, wherein an approach performed by the control device to determine whether the access frequency of the normal word line reaches one of the first threshold frequency and the second threshold frequency is taken by detecting the logical address and counting how many times the logical address has been detected.

7. A method, comprising:

copying a data stored in memory cells associated with a normal word line subject to a row hammer effect into memory cells associated with a hot word line before a condition, of an access frequency of the normal word line reaching a first threshold frequency, is satisfied;

accessing, based on a logical address, the normal word line before the condition is satisfied;

accessing, based on the logical address, the hot word line associated with the copied data only if the condition is satisfied;

accessing the data no longer from the normal word line only if the condition is satisfied;

accessing the normal word line if the access frequency of the normal word line does not reach a second threshold frequency; and accessing the hot word line if the access frequency of the normal line reaches the second threshold frequency.

8. The method of claim 7, wherein the copying the data stored in the memory cells associated with the normal word line subject to a row hammer effect into the memory cells associated with the hot word line before a condition is satisfied includes:

copying the data stored in the memory cells associated with the normal word line only if a first condition, of the access frequency of the normal word line reaching the first threshold frequency less than the second threshold frequency, is satisfied.

9. The method of claim 8, further comprising:

establishing the mapping relationship between the logical address and a hot physical address only if the first condition is satisfied.

10. The method of claim 7, wherein the accessing, based on the logical address, the hot word line associated with the copied data only if the condition is satisfied includes:

accessing the hot word line based on a hot physical address of the hot word line only if the condition is satisfied and a mapping relationship between the logical address and the hot physical address is present.

11. The method of claim 7, wherein the accessing, based on the logical address, the hot word line associated with the copied data only if the condition is satisfied includes:

accessing the hot word line based on a hot physical address of the hot word line only if a mapping relationship between the logical address and the hot physical address is present and the condition is satisfied.

12. The method of claim 11, further comprising determining whether the access frequency of the normal word line reaches one of the first threshold frequency and the second threshold frequency by detecting the logical address and counting how many times the logical address has been detected.

* * * * *